(12) United States Patent
Sridharan et al.

(10) Patent No.: US 6,486,534 B1
(45) Date of Patent: Nov. 26, 2002

(54) INTEGRATED CIRCUIT DIE HAVING AN INTERFERENCE SHIELD

(75) Inventors: Guruswami M. Sridharan; Kartik M. Sridharan, both of Jacksonville, FL (US)

(73) Assignee: Ashvattha Semiconductor, Inc., San Diego, CA (US)

( * ) Notice: Subject to any disclaimer, the term of this patent is extended or adjusted under 35 U.S.C. 154(b) by 0 days.

(21) Appl. No.: 09/785,620

(22) Filed: Feb. 16, 2001

(51) Int. Cl.[7] .................. H01L 23/60; H01L 23/552
(52) U.S. Cl. .................. 257/659; 257/700; 257/758
(58) Field of Search .................. 257/659, 700, 257/758, 774; 343/700 MS

(56) References Cited

U.S. PATENT DOCUMENTS

| | | | | |
|---|---|---|---|---|
| 4,551,747 A | * | 11/1985 | Gilbert et al. | 257/691 |
| 5,446,311 A | * | 8/1995 | Ewen et al. | 257/508 |
| 5,592,391 A | * | 1/1997 | Muyshondt et al. | 174/258 |
| 5,955,789 A | | 9/1999 | Vendramin | 257/786 |
| 5,986,340 A | | 11/1999 | Mostafazadeh et al. | 257/713 |
| 6,166,403 A | * | 12/2000 | Castagnetti et al. | 257/208 |
| 6,181,279 B1 | * | 1/2001 | Van Hoozen | 343/700 MS |
| 6,229,404 B1 | * | 5/2001 | Hatanaka | 257/698 |

FOREIGN PATENT DOCUMENTS

| JP | 10112517 A | * 4/1998 | H01L/23/14 |
|---|---|---|---|

* cited by examiner

*Primary Examiner*—Allan R. Wilson
(74) *Attorney, Agent, or Firm*—Foley & Lardner

(57) ABSTRACT

A package for housing a device (e.g., an integrated circuit chip or die) includes a Faraday cage. The Faraday cage is at least partially formed in the integrated circuit die. The die includes conductive vias and solder balls surrounding a circuit. The package can be a ball grid array (BGA) package or flip chip package. The package substrate can include a ground plane.

20 Claims, 5 Drawing Sheets

US 6,486,534 B1

INTEGRATED CIRCUIT DIE HAVING AN INTERFERENCE SHIELD

FIELD OF THE INVENTION

The present specification relates generally to integrated circuits (ICs) and packages for integrated circuits. More specifically, the present specification relates to integrated circuits having improved electromagnetic shielding properties.

BACKGROUND OF THE INVENTION

Integrated circuit packages generally contain integrated circuit chips or die-containing densely packed circuits. Large numbers of electronic circuits placed in close proximity on an integrated circuit die can cause electromagnetic interference. It is desirous to prevent circuits within an integrated circuit from dispersing energy into adjacent cells or circuits.

One system or circuit can radiate energy into another system or circuit and disrupt the functionality or operation of the other circuit. Radiation or other energy can be disbursed by substrate coupling, through common ground, or through common power supplies. The energy can induce spurious signals in neighboring circuits or even prevent the operation of other circuit components.

The interference problem is a particular problem at high frequencies (HF) and radio frequencies (RF). Electromagnetic interference between circuits on an integrated circuit can also be a problem at lower frequencies.

Heretofore, electromagnetic interference between circuitry has been prevented by limiting the number of systems or circuits on a chip. Each chip is generally associated with a single circuit that is a source or is sensitive to electromagnetic radiation. Each chip is packaged and that package can be externally shielded, such as, in a Faraday cage.

Limiting the number of circuits on the chip increases costs of the entire system because the system must employ more chips. In addition, the use of individual Faraday cages for each package increases the cost of the system. Shielding the chip also increases manufacturing and assembly costs. Further, the entire size of the system is increased by the increased number of packaged chips and the external Faraday shielding.

An example of conventional electromagnetic shielding techniques is disclosed in U.S. Pat. No. 5,986,340 which describes a ball grid array (BGA) package. The package includes an external Faraday cage formed around the integrated circuit die. The external Faraday cage is comprised of a heat sink surrounding the integrated circuit die and a metal plate on an upper peripheral surface of the heat sink.

U.S. Pat. No. 5,986,340 is similar to U.S. Pat. No. 5,955,789 and discloses a plastic ball grid array (BGA) electronic package in a cavity down configuration. The package includes an active element mounted on a package substrate and is for use in HF applications. An external Faraday cage is realized to protect the active element from external HF interferences. A row of solder balls connected in a zig-zag fashion on a bottom of the package substrate and platedthrough holes through the package substrate form lateral sides of the external Faraday cage. The top side of the external Faraday cage is formed of a metal cap and the bottom side of the external Faraday cage is formed by a ground plane of the main board. The package in U.S. Pat. No. 5,955,789 does not provide shielding within the integrated circuit (IC) die.

Accordingly, there is a need for a package system that includes an integrated Faraday cage. Further, there is a need for a Faraday cage which utilizes internal chip structures. Further still, there is a need for a die for use with a flip chip package that includes a low-cost electromagnetic shield. Yet further, there is a need for a chip with electromagnetic interference protection that is conducive to advanced packaging systems, such as, BGA and flip chip packages.

SUMMARY OF THE INVENTION

An exemplary embodiment relates to an integrated circuit package. The integrated circuit package includes an integrated circuit and a package substrate. The integrated circuit includes a first circuit and at least one second circuit. The first circuit is surrounded on lateral sides by a plurality of conductive vias. The package substrate has a ground plane. The conductive vias and the ground plane protect the second circuit from electromagnetic interference.

Another exemplary embodiment relates to an integrated circuit for mounting onto a flip chip package. The integrated circuit includes a semiconductor substrate, a plurality of metal layers, and a plurality of conductive vias. A first circuit is within a perimeter defined by the conductive vias and a second circuit is disposed outside the perimeter. The conductive vias provide electromagnetic shielding.

Still another embodiment relates to a method of providing a Faraday cage for an integrated circuit die contained in a package. The method includes providing conductive vias about a periphery of a circuit in the integrated circuit die, and mounting the integrated circuit die on a package substrate. The conductive vias are electrically coupled to a conductive plane of the package substrate.

BRIEF DESCRIPTION OF THE DRAWINGS

The invention will become more fully understood from the following detailed description, taken in conjunction with the accompanying drawings, wherein like reference numerals refer to like parts, and in which.

DETAILED DESCRIPTION OF THE PREFERRED EMBODIMENTS

Figure 1:
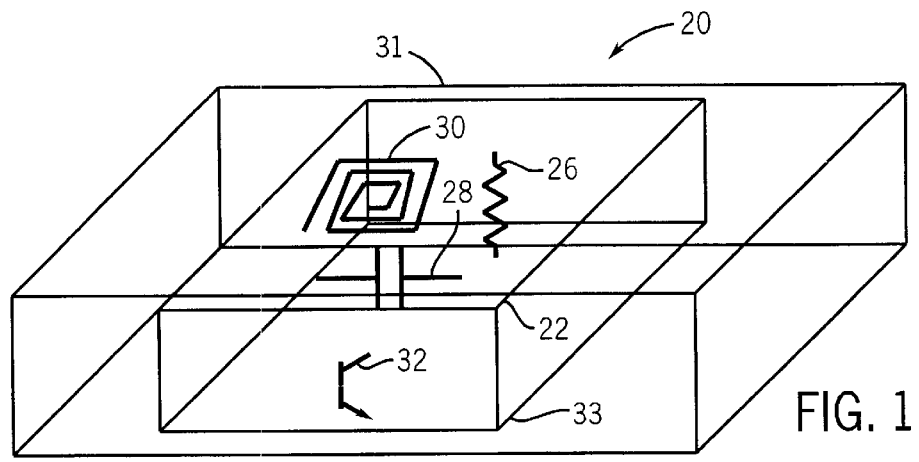
FIG. 1 is a schematic general block diagram perspective view of an integrated circuit die according to an exemplary embodiment.

With reference to FIG. 1, an integrated circuit chip or die 20 includes a circuit 22 protected by an internal Faraday cage or electromagnetic shielding. Circuit 22 is advantageously protected monolithically within die 20 without the high costs and assembly problems associated with external Faraday cages. Circuit 22 is preferably physically separate from other circuits located on portions 24 of die 20.

Figure 2:
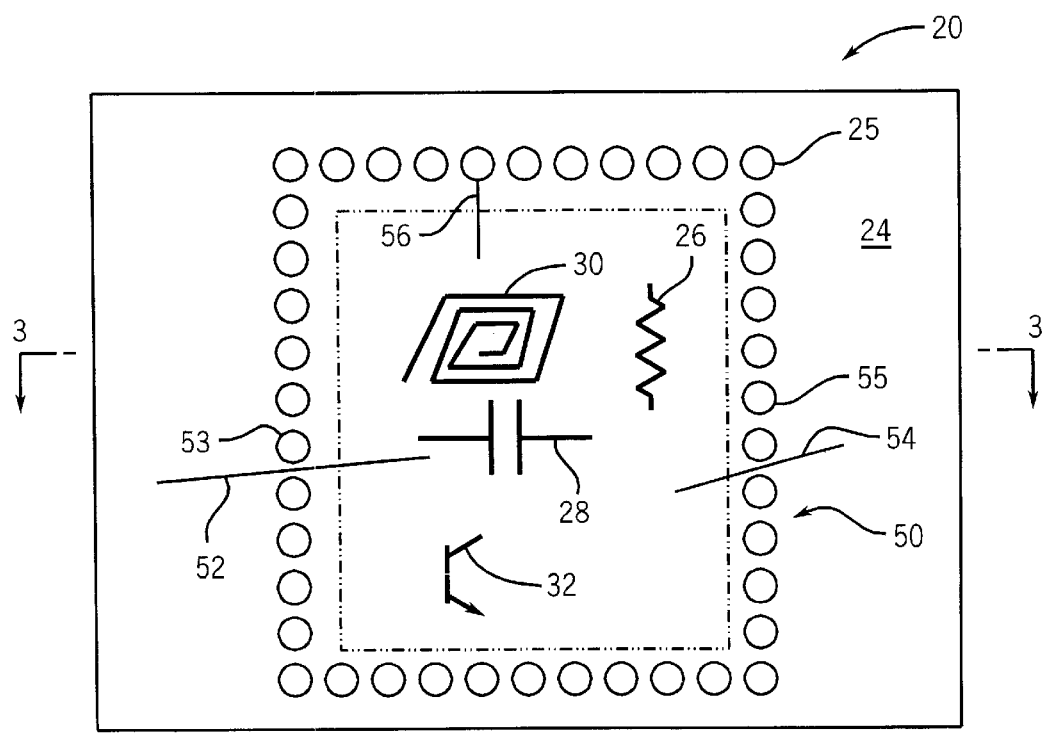
FIG. 2 is a schematic general block diagram bottom planar view of the integrated circuit die illustrated in FIG. 1.

Circuits located on other portions 24 of die 20 can be electrically connected with circuit 22. However, circuit 22 and circuits on other portions 24 of die 20 are protected from interference by internal Faraday cage or shielding 25 (FIG. 2). Shielding 25 can be manifested by integral components of die 20, such as, conductive vias, solder balls, and layers. Shielding 25 may include holes or gaps. Preferably, structures with holes or gaps can provide adequate shielding because the dimension of those holes or gaps is significantly smaller than the wavelengths associated with the electromagnetic radiation.

Circuit 22 can be any type of circuit. Preferably, circuit 22 can include one or more components, such as, resistor 26, capacitor 28, inductor 30, and transistor 32. Preferably, transistor 32 is located on a side 33 associated with a semiconductor substrate or thin film of die 20, and inductor 30 is located in a metal layer associated with a top side 31 of integrated circuit die 20. For example, inductor 30 can be located on a top-most metal level.

Die 20 can be an integrated circuit formed of conventional elements formed by conventional IC fabrication processes and tools. Die 20 can include a number of layers of metal (i.e., 4 or more) disposed above a semiconductor substrate, as discussed in detail below with respect to FIG. 3. Exemplary structures for die 20 are BICMOS IC structures, CMOS IC structures, or bipolar IC structures.

Circuit 22 can provide various functionality and can include any number of components. For example, circuit 22 can be an oscillator operating in low frequency to high frequency range. The oscillator can be an oscillator including resistors, an inductor, and a capacitor. Similarly, other circuits located in portions 24 of integrated circuit die 20 can have various functionalities. The other circuits can be oscillators, logic circuits, drivers, memory circuits, clock circuitry, or other devices.

Circuit 22, circuits located on portions 24, and components on die 20 are not described in a limiting fashion. Various types of circuits and functionality can be achieved on integrated circuit die 20 without departing from the scope of the invention.

Figure 3:
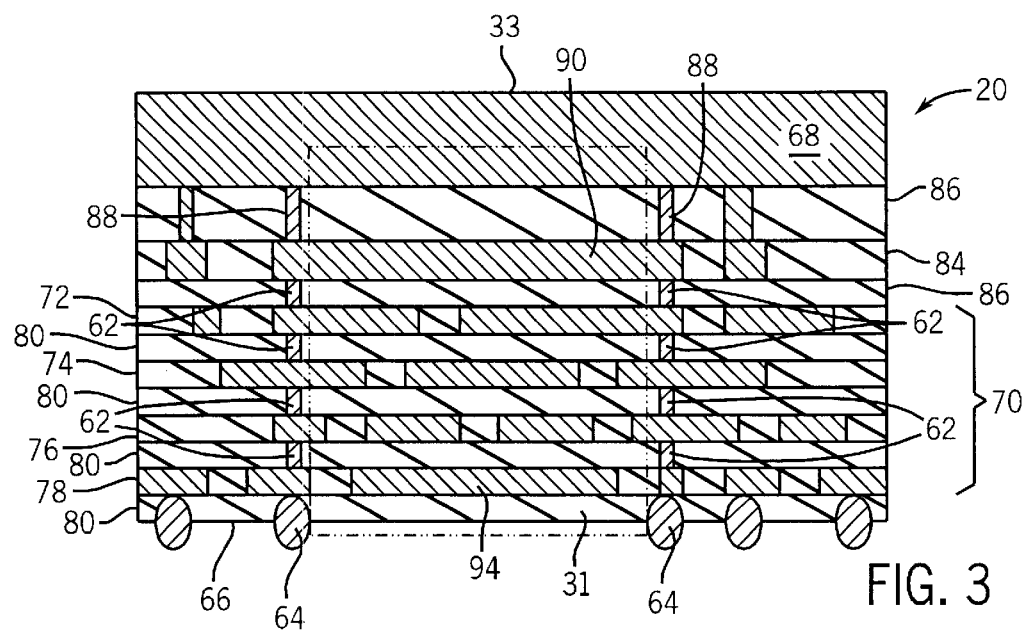
FIG. 3 is schematic general block diagram crosssectional view of the integrated circuit die illustrated in FIG. 2 about line 3—3.

With reference to FIGS. 1–3, integrated circuit die 20 includes a Faraday cage or shield 25 having a perimeter 50 surrounding circuit 22. Integrated circuit die 20 includes a semiconductor substrate 68 (FIG. 3) and conductive layers 70. Generally, layers 70 can be comprised of conductive metal layers 72, 74, 76 and 78. A dielectric layer 80 can be provided between each of conductive layers 72, 74, 76 and 78.

Layers 72, 74, and 76 can be approximately 0.5 microns thick. Layer 78 can be 3 microns thick. The spacing between layers 72, 74, and 76 can be approximately 1 micron. The spacing between layers 76 and 78 can approximately 2–3 microns.

Layers 72, 74, 76, and 78 include conductive lines arranged in various configurations. Layers 72, 74, 76, and 78 can be conventional metal layers (Al, Cu, and other alloys) patterned according to a conventional process. The FIGURES and the description are not intended to limit the disclosure to any particular number or configuration of conductive lines.

Conductive contacts or vias 62 are preferably provided through all of layers 72, 74, 76, 78 and 80 to provide electromagnetic interference protection for circuit 22. Vias 62 are shown in FIG. 3 as aligned vertically with respect to each other. However, vias 62 can be staggered and still achieve an advantageous shielding or isolation functionality for circuit 22. For example, vias 62 can include polysilicon, tungsten, and aluminum and can be formed in an etch and fill process. Vias 62 can be conventional interconnects formed in a conventional process. Vias 62 preferably define periphery 50 of shielding 25 about circuit 22 and extend from a polysilicon layer 84 to layer 78.

Polysilicon layer 84 is disposed between conductive layers 70 and semiconductor substrate 68. Polysilicon layer 84 can be patterned according to various arrangements. Dielectric layers 86 insulate layer 84 from metal layers 70 and semiconductor substrate 68.

Polysilicon layer 84 can be a conventional doped polysilicon material (either N-type or P-type). Preferably, portions of layer 84 are doped N-type and P-type according to design considerations. Layer 84 is coupled to substrate 68 by substrate contacts 88. Substrate contacts 88 extend through dielectric layer 86 and can be similar to conductive vias 62 described above. Layer 84 includes a center portion 90 coupled to substrate 68 by contacts 88. Other portions of layer 84 can be coupled to substrate 68 by other contacts.

Resistor 26 (FIGS. 1 and 2) is preferably located in substrate 68 or in layer 84 of circuit 22. Capacitors 28 are preferably located in substrate 68 or conductive layers 70 of circuit 22. Inductor 30 is preferably located in conductive layers 70 of circuit 22, and transistor 32 is located in substrate 68 of circuit 22.

A bottom most conductive layer (e.g., layer 78) can include a center portion 94. Inductor 30 can be fabricated within portion 94. Alternatively, inductor 30 can be located on a single lower metal layers, such as, metal layers 72, 74, or 76 or on a combination of layers 72, 74, 76, and 78.

Center portion 94 is preferably isolated, and electromagnetically shielded from portions 24 of die 20 by conductive layers 70, conductive vias 62, and center portion 90 of polysilicon layer 84. Alternatively, polysilicon layer 84 can be eliminated. Generally, the structure without portion 90 of polysilicon layer 84 can still provide sufficient shielding if dimensions are kept below the wavelength of the electromagnetic radiation. In another alternative, a center portion of one of conductive layers 70 (e.g., layer 72) can serve to provide shielding above center portion 94 of layer 78.

Solder balls 64 can be provided on an opposite end of die 20 than substrate 68 (end 31). Solder balls 64 are coupled (electrically and physically) to layer 78 and are grounded. Solder balls 64 are electrically coupled to vias 62.

Circuit 22 can include an input/output 52 (FIG. 2) provided through shielding 25 (through a gap in the Faraday cage). In one embodiment, circuit 22 includes an input/output 52 on one side 53 and an input/output 54 on an opposing side 55. Input/outputs 52 and 54 are provided through Faraday cage 25 (between vias 62).

According to one embodiment, vias 62 and contacts 68 are cylindrical (e.g., rectangular or circular). Vias 62 can be arranged in clusters and act as columns for shield 25. Vias 62 can be spaced apart from each other by a few microns to 100, of microns. Contacts 68 can be similarly spaced apart.

Vias 62 spaced apart by 100 microns can shield frequencies well into multi-gigahortz range. The spacing can be even greater for lower frequencies. Spacing between vias 62 can be determined by solder ball 64 size requirements for the flip-chip arrangement of die 20.

In another alternative embodiment vias 62 and contacts 68 are a continuous trench along periphery 50. Layers 70 include a conductive line following periphery 50 in this embodiment. According to this alternative, gaps can be provided in at least one of layers 70 for input/output 52 and input/output 54.

In a preferred embodiment, shielding 25 is grounded and provides a ground signal to circuit 22 via a conductor 56. Shielding 25 preferably comprises conductive vias 62 and solder balls 64. Conductive vias 62 are preferably attached to solder balls 64 on layer 78 of die 20. Contacts and other vias can be used to accommodate the attachment of solder balls 64 to surface 66.

Substrate 68 can be any type of substrate including a silicon-on-insulator substrate, a semiconductor substrate, a gallium arsenide (GaAs) substrate, a germanium (Ge) substrate, a thin film, or other device upon which circuit 22 can be fabricated. Preferably, substrate 68 is a lightly doped P-type substrate.

Figure 4:
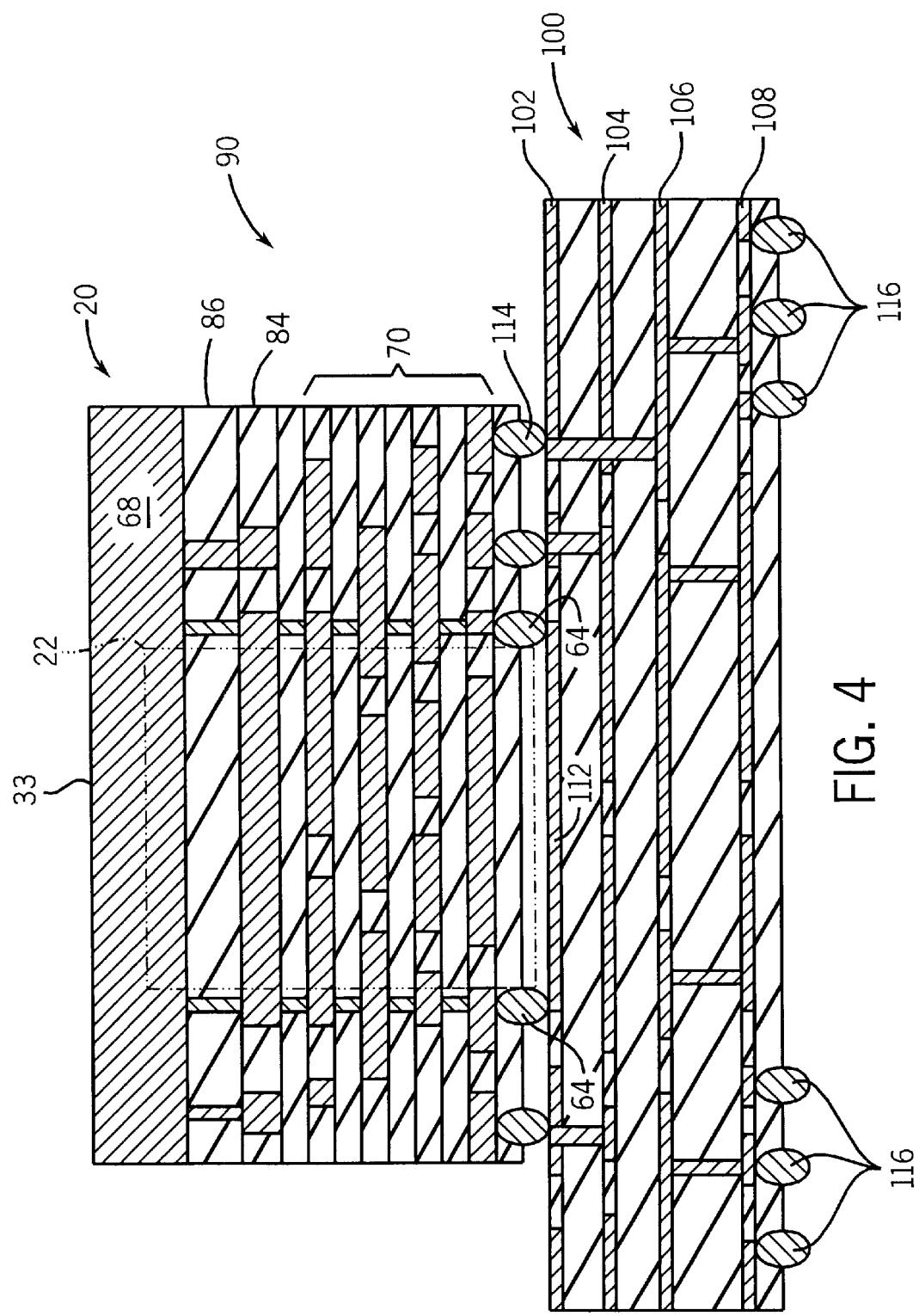
FIG. 4 is a schematic general block diagram cross-sectional view of the integrated circuit package illustrated in FIG. 3 mounted on a package substrate in accordance with an alternative embodiment.

With reference to FIG. 4, integrated circuit die 20 is shown coupled to an integrated circuit package substrate 100, thereby forming a package 90. Integrated circuit die 20 is preferably attached in a flip chip configuration.

Package substrate 100 can be a plastic substrate, a PCB board substrate, a ceramic substrate, or any material for receiving die 20. Package substrate 100 includes a conductive layer or two or more conductive layers. In FIG. 4, package substrate 100 includes four conductive layers: layer 102, 104, 106, and 108. Preferably, layer 102 includes contacts for receiving solder balls 64.

In one embodiment, layer 102 includes a conductive plane 112 electric coupleable to solder balls 64. Conductive plane 112 associated with layer 102 provides a bottom for the Faraday cage or shield 25. Conductive plane 112 preferably has an area corresponding with periphery 50 (FIG. 2) of shield 25. Although conductive plane 112 is shown in layer 102, any of layers 104, 106, or 108 can be utilized for the conductive plane.

Package 90 also includes solder balls 114 for coupling other circuitry on portion 24 (FIG. 1) of die 20 to package substrate 100. Various contact and via arrangements can be utilized to provide interconnections to substrate 100. Substrate 100 can also include a set of pins or solder balls 116 for coupling package substrate 100 to a printed circuit board or other module.

Die 20 can also include a cover layer (not shown) above substrate 68. Preferably, the cover layer is a conductive material for providing electromagnetic protection for substrate 68 of integrated circuit die 20.

Figure 5:
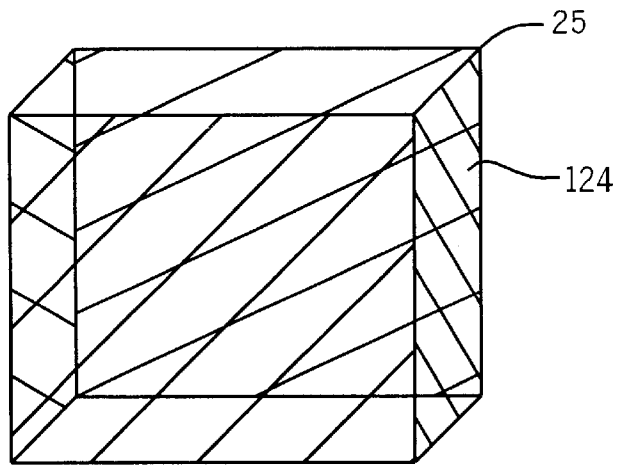
FIG. 5 is a schematic general block diagram showing side walls of a Faraday cage associated with the integrated circuit die illustrated in FIG. 3.
Figure 6:
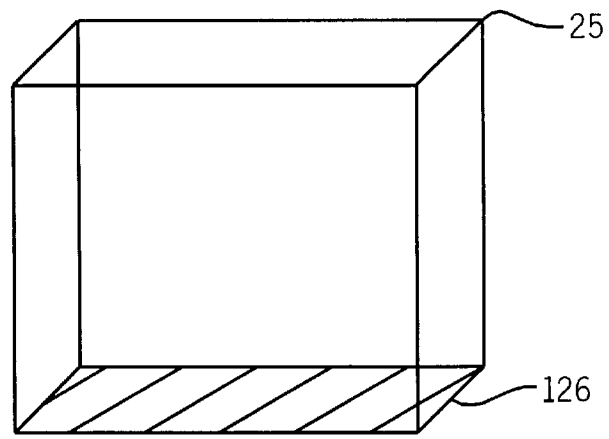
FIG. 6 is a schematic general block diagram of a Faraday cage showing a floor for the integrated circuit die illustrated in FIG. 3.

With reference to FIG. 5, Faraday cage or shield 25 includes lateral walls 124 (indicated by cross hatching in FIG. 5). Side or lateral walls 124 are formed by conductive vias 62 and solder balls 64 (FIG. 3). With reference to FIG. 6, a bottom 126 (indicated by cross hatching) of Faraday cage or shield 25 can be provided by ground plane. The ground plane can be plane 112 of layer 102 of package substrate 100. Alternatively, one of conductive layers 70 (e.g., layer 78) can provide the ground plane. Alternatively, an additional metal layer can be provide below layer 78 to provide the ground plane on integrated circuit die 20.

Figure 7:
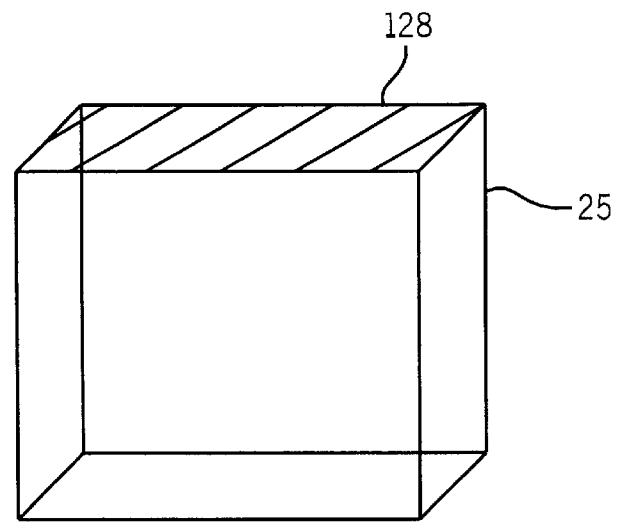
FIG. 7 is a schematic general block diagram showing a ceiling of a Faraday cage for the integrated circuit die illustrated in FIG. 3.

With reference to FIG. 7, a ceiling or top surface 128 (indicated by cross hatching) of Faraday cage or shield 25 can be provided by layer 84 (FIG. 3). Alternatively, a doped region within substrate 20 or a conductive layer above substrate 20 can be utilized.

Figure 8:
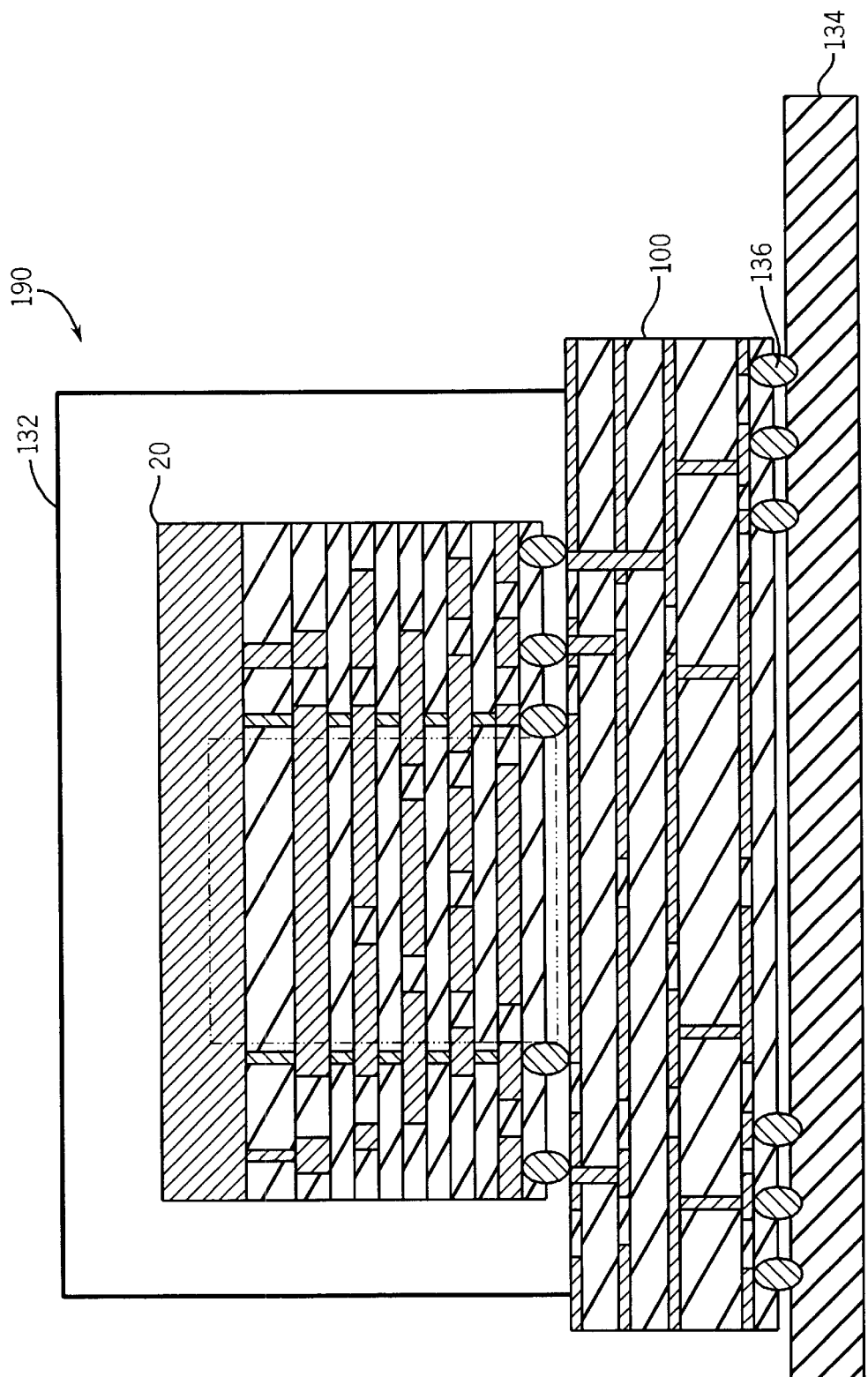
FIG. 8 is a schematic general block diagram cross-sectional view of an integrated circuit die attached to a package substrate and covered by a lid in accordance with still another exemplary embodiment.

With reference to FIG. 8, a package 190 similar to package 90 includes integrated circuit die 20 on a package substrate 100. Package 190 can include a lid 132 surrounding die 20. Lid 132 can be conductive and coupled to ground. Package substrate 100 can include pins or solder balls 136 for coupling to a printed wire circuit board 134. Alternatively, package 190 can be connected as a module, such as, a multi-chip module or other device for allowing die 20 to be coupled within a system.

Figure 9:
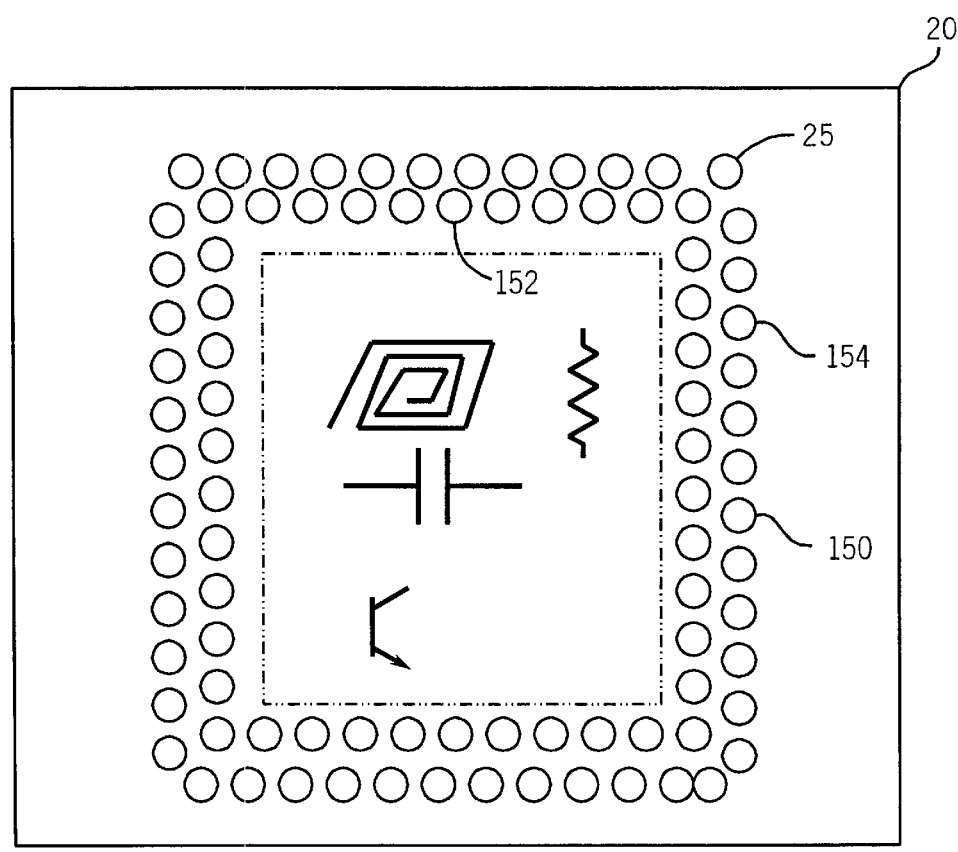
FIG. 9 is a schematic general block diagram bottom planar view of an integrated circuit die similar to the integrated circuit die illustrated in FIG. 2 including a double row of conductive vias in accordance with still another alternative embodiment.

With reference to FIG. 9, lateral walls 124 associated with Faraday cage or shield 25 (FIG. 5) can be comprised of a double layer of solder balls and conductive vias 150. The double layer is preferably configured so that a space between vias in an interior periphery 152 is covered by vias and solder balls on an outside periphery 154.

While the embodiments illustrated in the FIGURES and described above are presently preferred, it should be understood that these embodiments are offered by way of example only. For example, alternative materials and electrical contact configurations are contemplated as further examples of embodiments suitable to address the thermal expansion, miniaturization, corrosion and other design considerations addressed by the embodiments disclosed. Further, the sizes and shapes of conductive vias, plated through-holes, conductive lines, and other elements are not shown in a limiting fashion. The invention is not limited to a particular embodiment, but extends to various modifications that nevertheless fall within the scope of the appended claims.

What is claimed is:

1. An integrated circuit package, comprising:

an integrated circuit including a first circuit, and at least one second circuit, the first circuit being surrounded on lateral sides by a plurality of conductive vias; and a package substrate having a ground plane, whereby the conductive vias and ground plane protect the second circuit from electromagnetic interference wherein the integrated circuit includes a plurality of metal layers and wherein the vias extend through all of the metal layers, wherein the integrated circuit further includes a semiconductor substrate above the metal layers, wherein the semiconductor substrate is on a top end and the metal layers are on a bottom end, the bottom end being adjacent the package substrate.

2. The integrated circuit package of claim 1, wherein the conductive vias are electrically coupled to the ground plane.

3. The integrated circuit package of claim 2, wherein the conductive vias are coupled to the ground plane by solder balls.

4. The integrated circuit package of claim 1, wherein the package substrate is a ball grid array substrate.

5. The integrated circuit package of claim 1, further comprising:

a conductive cover above the integrated circuit.

6. The integrated circuit package of claim 1, wherein the first circuit is an oscillator.

7. An integrated circuit package, comprising:

an integrated circuit including a first circuit, and at least one second circuit, the first circuit being surrounded on lateral sides by a plurality of conductive vias; and a package substrate having a ground plane, whereby the conductive vias and ground plane protect the second circuit from electromagnetic interference from the first circuit, wherein the integrated circuit includes a plurality of metal layers and wherein the vias extend through all of the metal layers, wherein the first circuit includes an inductor disposed in one of the metal layers, the one metal layer being a metal layer farthest from the semiconductor substrate.

8. The integrated circuit package of claim 7 wherein the integrated circuit includes a plurality of metal layers and wherein the vias extend through all of the metal layers, wherein the integrated circuit further includes a semiconductor substrate above the metal layers, wherein the semiconductor substrate is on a top end and the metal layers are on a bottom end, the bottom end being adjacent the package substrate.

9. The integrated circuit package of claim 8, wherein the integrated circuit further includes a semiconductor substrate above the metal layers, wherein the semiconductor substrate is on a top end and the metal layers are on a bottom end, the bottom end being adjacent the package substrate.

10. An integrated circuit for mounting onto a flip chip package, the integrated circuit comprising:
    a semiconductor substrate;
    a plurality of metal layers; and
    a plurality of conductive vias, wherein a first circuit is within a perimeter defined by the conductive vias and a second circuit is disposed outside of the perimeter, whereby the conductive vias provide electromagnetic shielding, wherein the flip chip package is a ball grid array substrate having a ground plane extending at least over an area within the perimeter.

11. The integrated circuit of claim 10 wherein the first circuit includes an inductor disposed in a metal layer farthest from the substrate.

12. The integrated circuit of claim 10, wherein the metal layers include an inductor.

13. The integrated circuit of claim 12, wherein the semiconductor substrate includes a transistor.

14. The integrated circuit of claim 13, wherein the first circuit includes an oscillator.

15. The integrated circuit of claim 14, wherein the oscillator operates in a frequency range between 2 and 6 Hz.

16. A packaged integrated circuit including a Faraday cage, the packaged integrated circuit comprising:
    an integrated circuit die including conductive vias about a periphery of a circuit; and
    a package substrate, the integrated circuit being coupled to the package substrate, wherein the conductive vias are electrically coupled to a conductive plane of the package substrate, wherein the integrated circuit die includes metal layers of the substrate, the vias being disposed through the metal layers.

17. The package integrated circuit of claim 16, wherein the conductive plane is a ground plane.

18. The packaged integrated circuit of claim 16 wherein the circuit includes an inductor disposed in a metal layer farthest from the substrate.

19. The packaged integrated circuit of claim 18, wherein the circuit is coupled to at least one other circuit on the circuit die, the at least one other circuit being located outside the periphery.

20. The packaged integrated circuit of claim 16, wherein the circuit includes an oscillator.

* * * * *

UNITED STATES PATENT AND TRADEMARK OFFICE
CERTIFICATE OF CORRECTION

PATENT NO. : 6,486,534 B1
DATED : November 26, 2002
INVENTOR(S) : Guruswami M. Sridharan and Kartik M. Sridharan It is certified that error appears in the above-identified patent and that said Letters Patent is hereby corrected as shown below:

Column 2,
Line 45, delete "crossectional" and insert therefor -- cross-sectional --.

Column 3,
Line 64, add -- be -- before "approximately 2-3".

Column 5,
Line 3, delete "100," and insert therefor -- 100s --.
Line 5, delete "multi-gigahortz" and insert therefor -- multi-gigahertz --.
Line 63, insert -- a -- before "ground plane".

Column 6,
Line 44, insert -- from the first circuit -- after "interference".
Line 46, insert -- conductive -- after "wherein".
Line 51, insert -- to -- after "adjacent".

Column 7,
Line 10, insert -- , -- after "7".
Lines 10-11, delete "wherein the integrated circuit includes a plurality of metal layers and".
Line 12, insert -- conductive -- before "vias".
Line 22, insert -- to -- after "adjacent".

UNITED STATES PATENT AND TRADEMARK OFFICE
CERTIFICATE OF CORRECTION

PATENT NO. : 6,486,534 B1
DATED : November 26, 2002
INVENTOR(S) : Guruswami M. Sridharan and Kartik M. Sridharan It is certified that error appears in the above-identified patent and that said Letters Patent is hereby corrected as shown below:

Column 8,
Line 1, insert -- , -- after "10".
Line 22, delete "package" and insert therefor -- packaged --.
Line 24, insert -- , -- after "16".

Signed and Sealed this

Twenty-seventh Day of May, 2003

JAMES E. ROGAN
*Director of the United States Patent and Trademark Office*